United States Patent
Fan et al.

(10) Patent No.: US 8,298,666 B2
(45) Date of Patent: *Oct. 30, 2012

(54) MOISTURE RESISTANT ELECTROLUMINESCENT PHOSPHOR WITH HIGH INITIAL BRIGHTNESS AND METHOD OF MAKING

(75) Inventors: Chen-Wen Fan, Sayre, PA (US); Tuan A. Dang, Sayre, PA (US); Joan M. Coveleskie, Sayre, PA (US); Frank A. Schwab, Towanda, PA (US); Dale E. Benjamin, Athens, PA (US); David C. Sheppeck, Sayre, PA (US)

(73) Assignee: Global Tungsten & Powders Corp., Towanda, PA (US)

( * ) Notice: Subject to any disclaimer, the term of this patent is extended or adjusted under 35 U.S.C. 154(b) by 627 days.

This patent is subject to a terminal disclaimer.

(21) Appl. No.: 11/622,633

(22) Filed: Jan. 12, 2007

(65) Prior Publication Data

US 2007/0172657 A1    Jul. 26, 2007

Related U.S. Application Data

(60) Provisional application No. 60/766,542, filed on Jan. 26, 2006.

(51) Int. Cl.
*B32B 5/16* (2006.01)
*C09K 11/02* (2006.01)
*C09K 11/58* (2006.01)

(52) U.S. Cl. .............. 428/403; 252/301.6 S; 428/404

(58) Field of Classification Search .............. 428/403, 428/404; 252/301.6 S
See application file for complete search history.

(56) References Cited

U.S. PATENT DOCUMENTS

| 5,009,808 A | 4/1991 | Reilly et al. |
| 5,080,928 A | 1/1992 | Klinedinst et al. ............... 427/70 |
| 5,220,243 A | 6/1993 | Klinedinst et al. |
| 5,244,750 A | 9/1993 | Reilly et al. |
| 5,593,782 A * | 1/1997 | Budd ............................ 428/403 |
| 5,643,496 A | 7/1997 | Brese et al. |
| 5,702,643 A | 12/1997 | Reddy et al. |
| 6,064,150 A | 5/2000 | Klinedinst et al. |
| 6,090,311 A | 7/2000 | Brese et al. |
| 6,153,123 A | 11/2000 | Hampden-Smith et al. ......................... 252/301.45 |

(Continued)

FOREIGN PATENT DOCUMENTS

CN    200780001473.1    2/2009

(Continued)

OTHER PUBLICATIONS

PCT/US2007/060538, Mar. 28, 2008, International Search Report.

(Continued)

*Primary Examiner* — Hoa (Holly) Le
(74) *Attorney, Agent, or Firm* — Ballard Spahr LLP

(57) ABSTRACT

An electroluminescent (EL) phosphor is described wherein each individual phosphor particle is encapsulated in an inorganic coating, preferably aluminum oxyhydroxide. The encapsulated phosphor shows an extreme insensitivity to atmospheric moisture and suffers only minor loss of initial brightness in lamps. The method of applying the coating is a hybrid process, which involves EL phosphor particles first being coated with a thin inorganic film using an atomic layer deposition (ALD) method in a fluidized bed wherein the precursors are introduced sequentially in repeated cycles, subsequently followed by an additional coating layer applied by a chemical vapor deposition (CVD) method in which the precursors are introduced simultaneously.

2 Claims, 2 Drawing Sheets

U.S. PATENT DOCUMENTS

| | | | |
|---|---|---|---|
| 6,309,700 B1 | 10/2001 | Fan et al. | 427/213 |
| 6,456,002 B1 * | 9/2002 | Klinedinst et al. | 313/503 |
| 6,613,383 B1 | 9/2003 | George et al. | |
| 6,702,959 B2 * | 3/2004 | Fan et al. | 313/503 |
| 6,713,177 B2 | 3/2004 | George et al. | |
| 6,733,826 B2 * | 5/2004 | Fan et al. | 427/213 |
| 6,743,475 B2 | 6/2004 | Sharp et al. | 427/255.31 |
| 6,849,297 B1 * | 2/2005 | Fan et al. | 427/215 |
| 6,913,827 B2 | 7/2005 | George et al. | |
| 7,001,665 B2 * | 2/2006 | Klinedinst | 428/403 |
| 7,498,053 B2 * | 3/2009 | Lim et al. | 427/66 |
| 7,833,437 B2 * | 11/2010 | Fan et al. | 252/301.6 S |
| 2002/0106451 A1 | 8/2002 | Skarp et al. | 427/248.1 |
| 2003/0172872 A1 | 9/2003 | Thakur et al. | 118/715 |
| 2007/0298250 A1 | 12/2007 | Weimer et al. | 428/336 |

FOREIGN PATENT DOCUMENTS

| | | |
|---|---|---|
| CN | 200780001477.X | 2/2009 |
| EP | 0 455 401 B2 | 7/1996 |
| EP | 0 928 826 | 7/1999 |
| EP | 0 964 043 | 12/1999 |
| EP | 07710126.9 | 10/2008 |
| EP | 07710127.7 | 10/2008 |
| WO | WO 01/36559 | 5/2001 |
| WO | WO 01/36559 A2 * | 5/2001 |
| WO | WO 01/82390 | 11/2001 |

OTHER PUBLICATIONS

PCT/US2007/060538, Mar. 28, 2008, Written Oppinion.
PCT/US2007/060538, Jul. 29, 2008, International Preliminary Report on Patentability.
PCT/US2007/060539, Mar. 26, 2008, International Search Report.
PCT/US2007/060539, Mar. 26, 2008, Written Opinion.
PCT/US2007/060539, Mar. 26, 2008, International Preliminary Report on Patentability.
U.S. Appl. No. 11/622,523, filed May 7, 2009, Non-Final Rejection.
U.S. Appl. No. 11/622,523, filed Nov. 7, 2009, Response to Non-Final Rejection.
U.S. Appl. No. 11/622,523, filed Nov. 18, 2009, Final Rejection.
Chinese Office Action dated Feb. 13, 2012, Chinese Application No. 200780001477.X.
Response to Chinese Office Action dated May 2, 2012, Chinese Application No. 200780001477.X.
Chinese Office Action dated Mar. 9, 2012, Chinese Application No. 200780001473.1.
European Office Action dated Mar. 29, 2012, European Application No. 07 710 126.9.
Supplemental Search Report dated Jan. 13, 2012, European Application No. 07 710 127.7.

* cited by examiner

MOISTURE RESISTANT ELECTROLUMINESCENT PHOSPHOR WITH HIGH INITIAL BRIGHTNESS AND METHOD OF MAKING

CROSS REFERENCE TO RELATED APPLICATIONS

This application claims the benefit of U.S. Provisional Application No. 60/766,542, filed Jan. 26, 2006.

TECHNICAL FIELD

This invention relates to electroluminescent phosphors and more particularly to electroluminescent phosphors that have been treated to be moisture resistant. Still more particularly, this invention relates to electroluminescent phosphors having greatly reduced moisture-induced degradation and high initial brightness.

BACKGROUND OF THE INVENTION

Electroluminescent (EL) lamps may be divided generally into two types: (1) thin-film EL lamps that are made by depositing alternating films of a phosphor and dielectric material on a rigid glass substrate usually by a vapor deposition technique such as CVD or sputtering; and (2) thick-film EL lamps which are made with particulate materials that are dispersed in resins and coated in alternating layers on sheets of plastic. In the latter case, the thick-film electroluminescent lamps may be constructed as thin, flexible lighting devices thereby making them suitable for a greater range of applications.

A cross-sectional illustration of a conventional thick-film EL lamp is shown in FIG. 1. The lamp 2 has two dielectric layers 20 and 22. A first conductive material 4, such as graphite, coated on a plastic film 12$b$ forms a first electrode of the lamp 2 (this electrode could also comprise a metal foil); while a thin layer of a transparent conductive material 6, such as indium tin oxide, coated on a second plastic film 12$a$ forms a second electrode. Sandwiched between the two conductive electrodes 4 and 6 are two layers 20 and 22 of dielectric material 14 which may be, for example, cyanoethyl cellulose, cyanoethyl starch, poly-(methylmethacrylate/ethyl acrylate) and/or a fluorocarbon polymer. Adjacent to the first electrode 4 is a layer of dielectric material 14 in which are embedded particles of a ferroelectric material 10, preferably barium titanate. Adjacent to the second electrode 6 is a layer of dielectric material 14 in which are embedded particles of an electroluminescent phosphor 8. When an alternating voltage is applied to the electrodes, visible light is emitted from the phosphor.

The electroluminescent phosphors available for thick-film EL lamps are primarily comprised of zinc sulfide that has been doped with various activators, e.g., Cu, Au, Ag, Mn, Br, I, and Cl. Examples of zinc sulfide-based EL phosphors are described in U.S. Pat. Nos. 5,009,808, 5,702,643, 6,090,311, and 5,643,496. Preferred EL phosphors include ZnS:Cu phosphors which may be co-doped with Cl and/or Mn.

The brightness of electroluminescent phosphors, and in particular the ZnS:Cu phosphors, significantly deteriorates due to the presence of moisture during the application of the electric field. It has been reported that the deterioration of the brightness of the zinc sulfide-based phosphors is caused by increasing sulfur vacancy, which is produced by the following reaction:

$$ZnS+2H_2O \rightarrow SO_2+Zn+2H_2$$

Sulfur escapes from the phosphor in the form of $SO_2$; as a result, sulfur vacancy and zinc are left in the phosphor.

Therefore, it is important to incorporate moisture protection measures to prolong the light emission of EL lamps. Typically, the individual particles of EL phosphors are encapsulated with an inorganic coating in order improve their resistance to moisture-induced degradation. Examples of such coatings are described in U.S. Pat. Nos. 5,220,243, 5,244,750, 6,309,700, and 6,064,150. These inorganic coatings are formed via a chemical vapor deposition (CVD) reaction while the phosphor particles are suspended within a gas-fluidized bed. In general, a thin yet continuous coating is deposited upon the surface of the phosphor particles, thereby protecting them from the effects of atmospheric moisture.

A preferred coating for EL phosphors results from the hydrolysis of trimethylaluminum (TMA). The hydrolyzed TMA coating and CVD process are described in U.S. Pat. Nos. 5,080,928 and 5,220,243 which are incorporated herein by reference. The composition of the hydrolyzed TMA coating is believed to be primarily aluminum oxyhydroxide (AlOOH), but may be varied in composition between aluminum oxide and aluminum hydroxide depending upon the reaction conditions. For the sake of convenience, the composition of the hydrolyzed TMA coating will be referred to herein as aluminum oxyhydroxide (AlOOH) although it is to be understood that this also encompasses the full range of compositions from aluminum oxide ($Al_2O_3$) to aluminum hydroxide ($Al(OH)_3$). The reaction of TMA and water can be described as follows:

$$Al(CH_3)_3+(3+n)/2H_2O \rightarrow AlO_{(3-n)/2}(OH)_2+3CH_4$$
$$(0 \leq n \leq 3)$$

FIG. 2 is a graph of the 100-hour maintenance as a function of aluminum content (coating thickness) for conventional AlOOH CVD-coated EL phosphors operated in an EL lamp at 50° C., 90% rel. humidity. The 100-hour maintenance is defined as the 100-hour light output divided by 0-hour light output and multiplied by 100%, (100-hour/0-hour)×100%. Compared to the uncoated phosphor, the CVD-encapsulated EL phosphor always suffers a significant loss in initial brightness as a result of the coating process. It is suspected that the decrease may be caused by a decrease in the electric field inside the phosphor particles due to the presence of the outer coating.

SUMMARY OF THE INVENTION

As used herein, the term initial brightness (IB) refers to the brightness of the phosphor in an electroluminescent lamp when the lamp is operated for the very first time. A brief period of a few minutes may elapse in order to allow for the measurement to be made and the light output of the lamp to be stabilized. This is also referred to as the 0-hour brightness. Because of the rapid decrease in brightness caused by moisture-induced degradation, it is preferred to laminate the EL lamp containing the uncoated phosphor in a moisture resistant package in order to make the initial brightness measurement. The retained initial brightness (RIB) for a coated EL phosphor is expressed as a percentage and determined with respect to the initial brightness of the same EL phosphor in its uncoated state when operated in an EL lamp under the same conditions; RIB=(IB(coated)/IB(uncoated))×100%. Preferably, the retained initial brightness for the coated EL phosphors of this invention is at least 90%.

It has been discovered that atomic layer deposition (ALD) is able to provide a thinner coating on the EL phosphor particles than the conventional CVD method while at the same time maintaining an equivalent level of moisture protection and at a higher level of initial brightness. ALD is an attractive thin-film deposition technique because it allows atomic level control over the deposition process. ALD coatings have many excellent features like conformality, uniformity, repeatability and accurate thickness control. In fact, ALD is a special type of CVD that uses two chemical vapor precursors that are periodically injected into the deposition system in such a manner that both are not present in the reactor in the vapor phase at the same time. The purpose for doing this is to force the precursors react on the substrate and not in the gas phase during ALD deposition. Examples of ALD coating processes are described in U.S. Pat. Nos. 6,913,827 and 6,613,383 which are incorporated herein by reference.

In an ALD deposition process, one precursor is adsorbed on the surface as a monolayer; the system is then purged to remove the excess precursor; the second precursor is injected to react with the adsorbed material; and then the system is purged again. Carrier gas flow (typically $N_2$) and vacuum pumping is used to purge the system after each precursor pulse. The ALD deposition cycle is repeated, with a dosing time for each precursor on the order of 10 to 20 seconds, until the required film thickness is achieved. This leads to very uniform deposition over very complex surfaces such as the high-aspect-ratio features on semiconductor devices. The reaction is self-limiting and the growth rates typically are on the order of 0.1 to 1.5 Å per cycle resulting in very defect-free films. Since the coating is essentially formed one monolayer at a time, ALD is more likely to achieve a denser coating than prior CVD methods.

It has been demonstrated for an ALD-applied aluminum oxyhydroxide coating that a coating thickness of at least about 900 Å, and more preferably about 1200 Å, is needed to effectively protect an EL phosphor from the moisture-induced degradation. Unfortunately, it takes on the order of 800 ALD deposition cycles to achieve a 1200 Å thickness. In order to be cost effective and facilitate large-scale manufacturing, it would be desirable to achieve an equivalent performance (high initial brightness and high moisture-resistance) at significantly fewer ALD cycles, preferably 100 ALD deposition cycles or less. Otherwise, to build a strong moisture barrier for EL phosphors, ALD will be a time-consuming and not very cost-effective method.

Although the CVD method described in U.S. Pat. Nos. 5,080,928 and 5,220,243 causes more of a loss of initial brightness than ALD, the CVD method has been successfully demonstrated on a commercial scale. Thus, it would be desirable to provide a hybrid coating method that took advantage of the benefits of the CVD and ALD technologies while minimizing their drawbacks and thereby provide EL phosphors with strong moisture resistance and a high retained initial brightness.

Thus, in one aspect of the invention, there is provided an electroluminescent phosphor comprised of individual particles of a zinc sulfide-based electroluminescent phosphor wherein each particle is encapsulated in inorganic coating. The coated phosphor exhibits a retained initial brightness of at least 90% and a 100-hour maintenance of at least 60% when incorporated in an electroluminescent lamp that is operated at 100V and 400 Hz in a 50° C., 90% relative humidity environment. More preferably, the retained initial brightness is at least 90% and the 100-hour maintenance is at least 75% when operated in an EL lamp at 50° C. and 90% relative humidity.

In another aspect of the invention, there is provided a hybrid ALD/CVD coating method that involves the steps of: (a) forming a fluidized bed of electroluminescent phosphor particles; (b) introducing a first vapor phase precursor into the fluidized bed; (c) purging the fluidized bed; (d) introducing a second vapor phase precursor into the fluidized bed to react with the first precursor and form an inorganic coating on the phosphor particles; (e) purging the fluidized bed; (f) repeating steps (a) through (e) until a desired coating thickness is reached; and (g) introducing the first and second vapor phase precursors simultaneously into the fluidized bed to further increase the coating thickness.

Although AlOOH is a preferred coating, it is expected that other inorganic coatings may be applied on electroluminescent phosphors by the method of this invention with similar benefits. Such other inorganic coatings include, but are not limited to, aluminum nitride, silicon dioxide and titanium dioxide.

DETAILED DESCRIPTION OF THE INVENTION

Figure 1:
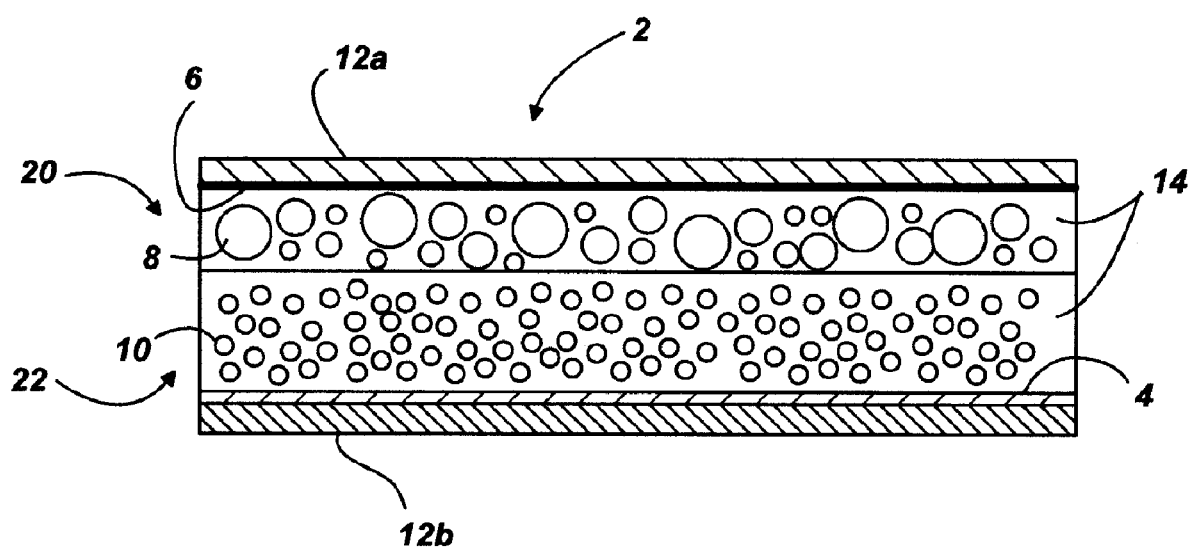
FIG. 1 is a cross-sectional illustration of a conventional thick-film EL lamp.

For a better understanding of the present invention, together with other and further objects, advantages and capabilities thereof, reference is made to the following disclosure and appended claims taken in conjunction with the above-described drawings.

The present invention is an electroluminescent phosphor wherein each individual phosphor particle is encapsulated in an inorganic coating, preferably aluminum oxyhydroxide. The encapsulated phosphor shows an extreme insensitivity to atmospheric moisture and suffers only minor loss of initial brightness in lamps. The method of this invention combines the advantage of the ALD to provide EL phosphor particles with a coating that yields little loss of initial brightness with the demonstrated advantage of CVD as a proven large-scale manufacturing technology.

In particular, the method of this invention is a hybrid coating process, which involves EL phosphor particles first being coated with a thin inorganic film using an ALD method in a fluidized bed, subsequently followed by an additional coating layer applied by a CVD method. In a preferred method, the ALD coating is formed by introducing into a fluidized bed of phosphor particles a series of alternating doses of vaporized trimethylaluminum (TMA) and water vapor in an ABAB . . . sequence to deposit an aluminum oxyhydroxide film essentially one monolayer at a time on the surface of the phosphor particles. These two precursors are pulsed sequentially in an inert carrier gas into the coating reactor with a purge between the pulses to prevent vapor phase reactions. The fluidized bed reactor is maintained at 450K and 1 Torr of pressure. Since each pair of precursor pulses (one cycle) produces approximately a monolayer of film, the thickness of the resulting film may be precisely controlled by the number of deposition cycles.

The coating thickness can be correlated with the amount of aluminum deposited on the phosphor. For example, approximately 0.2 weight percent (wt. %) aluminum is equivalent to an AlOOH coating thickness of about 110 Å. This is also the amount that is deposited by 100 ALD cycles, which is the preferred amount of the ALD coating applied on EL phosphor. The coating thickness is estimated by using Sputtered Neutral Mass Spectroscopy (SNMS) measurements and a standard $Ta_2O_5$ film as a reference material.

The ALD-coated phosphors are then further coated in a fluidized bed reactor by using the CVD method. The CVD process is conducted by feeding both vaporized TMA and water vapor precursors simultaneously into the fluidized bed reactor which was maintained at 450K and one atmosphere pressure. The CVD process builds the AlOOH coating much more rapidly than the ALD method since the reactants are introduced simultaneously and it is not necessary to repeatedly purge the reactor. To meet the 100-hour maintenance requirement for EL lamps under 50° C./90% relative humidity conditions, it is preferred that the CVD process be continued until the total amount of aluminum deposited reaches from about 1 wt. % to about 2.5 wt. %, and more preferable at least about 2.2 wt. %.

The present invention will be described in further detail with reference to the following examples. However, it should be understood that the present invention is by no means restricted to such specific examples.

Thick-film electroluminescent test lamps are constructed in the following general manner. Phosphors are mixed with a binder (DuPont Microcircuit Materials Luxprint 8155 binder). The percentage of phosphor in the liquid binder is 60 wt. %. The phosphor suspension is screen-printed onto a 0.0065-0.0075 in.-thick PET film having a transparent, conductive layer of indium-tin oxide, for example OC-200 available from CP Films. The polyester screen has 137 or 140 threads per inch. After drying, a dielectric layer is formed by two applications of a barium titanate-filled dielectric ink (DuPont Microcircuit Materials Luxprint® 8153 Electroluminescent Dielectric Insulator) which is applied over the phosphor layer and dried between applications. After drying the dielectric layer, a rear carbon electrode (DuPont Microcircuit Materials Luxprint® 7144 Carbon Conductor) is applied over the dielectric layer. The preferred method for applying the layers to the electroluminescent lamp is screen printing, also referred to as "silk-screening." However other coating techniques such as draw blade coating and roll-to-roll coating may also be used successfully. After drying, the electroluminescent lamp is ready for brightness and maintenance tests. Lamps tested in a humidity chamber require the rear carbon electrode to be covered in order to prevent liquid water from entering the lamp. In this case, a thin pressure-sensitive adhesive tape (3 M Scotch 821 tape) is applied to the carbon electrode.

Example 1

About 2.0 kilograms of a green-emitting ZnS:Cu electroluminescent phosphor (Type 729, OSRAM SYLVANIA Products Inc., Towanda, Pa.) is charged into a vibrated fluidized bed reactor for ALD coating. The fluidized bed reactor is a stainless steel column with a metal disc as the gas distributor. High-purity nitrogen is the fluidizing gas. The entire reactor is surrounded by a clamshell-type furnace and reactor temperature is maintained at 450K. Trimethylaluminum (TMA) and deionized water are used as precursors and the reaction is split into two self-limiting half-reactions to deposit an aluminum oxyhydroxide coating. A series of pneumatically activated valves control the automatic and sequential dosing of precursors during the coating cycles. Both precursors are delivered via their vapor pressures and the system is evacuated and kept at pressure of 1.0 Torr at all times. After each precursor dose, the system is flushed with nitrogen to eliminate unreacted species as well as any methane formed during reaction. The process is continued for 100 ALD coating cycles to form the ALD-coated phosphor.

Example 2

In this example, 600 grams of the ALD-coated EL phosphor prepared in Example 1 were charged into a 4.1 cm inside diameter quartz tube with a total length of 60 cm. The bed of phosphor particles in reactor was fluidized by passing the nitrogen gas with the TMA precursor through the 5 μm pore size metal frit in the bottom of the reactor. Water vapor entrained in a nitrogen gas stream was introduced into reactor through a hollow agitator and injected into the fluidized bed of particles through a porous metal sparger located in the agitator. Both vaporized TMA and water vapor were flowed into the reactor simultaneously and continuously until the end of coating process. The TMA and water bubblers were kept at 41° C. and 74° C., respectively. The flow rates of the nitrogen carrier gas through the TMA and water bubblers were controlled at 1.5 liter/min and 2.0 liter/min, respectively. In addition, the temperature of the reactor was maintained at 450K by furnace elements, which surround the reactor. The fluidized bed reactor was operated under atmospheric pressure at all times. Several 50-gram samples were collected from the reactor at different times during the 2-hour coating run. These samples include CVD #1 (1 hour), CVD #2 (1.25 hours), CVD #3 (1.5 hours), CVD #4 (1.75 hours), and CVD #5 (2 hours). The samples were submitted for lamp tests and analyzed for aluminum concentration by Atomic Absorption Spectroscopy.

Example 3

The phosphor in this example was prepared as in Example 2, except that the CVD coating time was extended to 4.0 hours. The collected samples from this example include CVD #6 (2.5 hours), CVD #7 (3 hours), CVD #8 (3.5 hours), and CVD #9 (4 hours).

Figure 2:
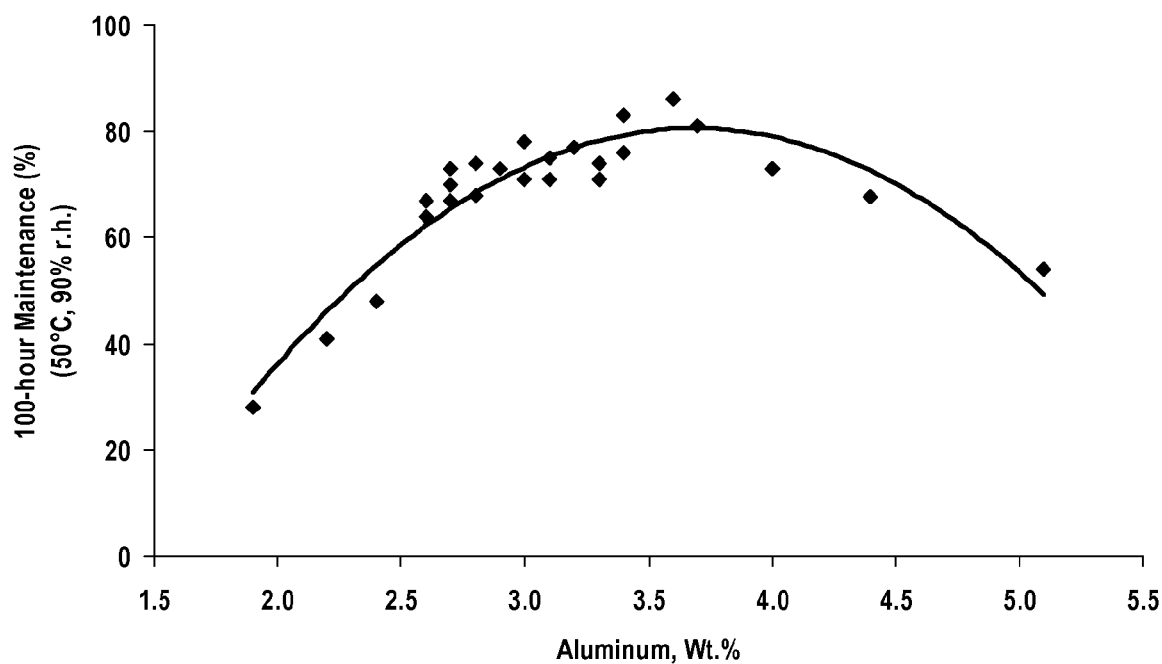
FIG. 2 is a graph of the 100-hour maintenance as a function of aluminum content for conventional CVD-coated EL phosphors operated in an EL lamp at 50° C., 90% rel. humidity.

A control sample of a conventional CVD-coated phosphor made from the same uncoated phosphor used in Example 1 was tested to compare with ALD/CVD-coated examples. This phosphor was encapsulated by introducing both vaporized TMA and water vapor precursors simultaneously into a fluidized bed reactor, which was maintained at atmospheric pressure and 450K during the CVD coating process. The coating process was continued until the amount of aluminum deposited reached 3.8 wt. % which represents in the case of the conventional CVD method the coating thickness for the optimal combination of retained initial brightness and high moisture resistance (FIG. 2). As an additional control, an ALD-coated phosphor was made with 800 ALD deposition cycles using the same uncoated phosphor.

Thick-film electroluminescent test lamps were made containing uncoated phosphor as well as the encapsulated phosphors. The control lamps containing the uncoated phosphor were specially packaged in ACLAR, a water-impermeable, transparent film supplied by Honeywell Inc., so that the moisture sensitivity of the uncoated phosphor could be minimized. Identical lamps containing encapsulated phosphors were operated at 100 V and 400 Hz for 100 hours in two environments. In Lamp Test #1, the conditions were 21° C. and 50% relative humidity. For Lamp Test #2, accelerated environmental testing was conducted in a humidity chamber at 50° C. and 90% relative humidity.

The lamp and phosphor measurements are summarized in Tables 1 and 2. Phosphors which are susceptible to moisture-induced degradation exhibit a rapid decrease in light output under the accelerated environmental testing and therefore have poor 100-hour maintenance values. The aluminum content of ALD-coated and ALD/CVD-coated phosphors, expressed as a percentage of the total coated phosphor weight, were also determined.

Figure 3:
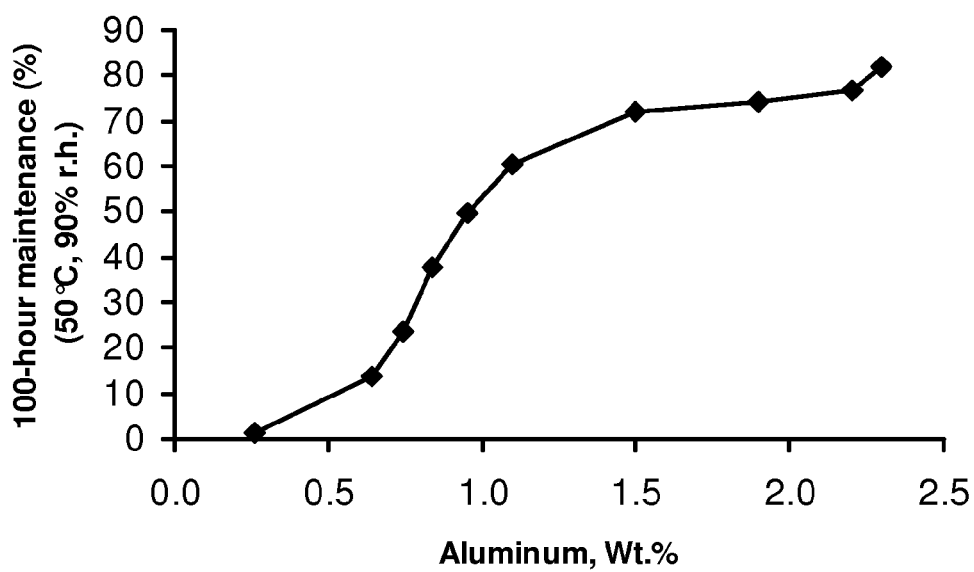
FIG. 3 is a graph of 100-hour humidity maintenance versus total aluminum coating weight for coated phosphors made by the hybrid ALD/CVD method of this invention.

As shown in Tables 1 and 2, the 100-hour humidity maintenance of an ALD/CVD coated lamp increases as the amount of aluminum increases, i.e., with increasing AlOOH coating thickness. By plotting the aluminum content of the phosphors versus the 100-hour humidity maintenance (FIG. 3), it is shown that above about 0.6 wt. % Al the 100-hour maintenance improves in a linear relation with the increasing coating weight until the aluminum amount reaches 1.1 wt. % after which there is a gradual leveling off.

Referring again to the tables, it can be seen that the coating on sample CVD#7 (1.9 wt. % Al) is still too thin to provide the phosphor with an equivalent level of moisture protection compared to the standard CVD-coated phosphor, 74.3% vs. 76.1% 100-hour maintenance, respectively. At 800 cycles, the ALD-coated phosphor (1.6 wt. % Al) matches the 100-hour maintenance of the standard CVD-coated phosphor, 76.9% vs. 76.1%. Thus, the thinner 800 cycle ALD-coated phosphor also has a better 100-hour maintenance than the slightly thicker (1.9 wt. % Al) CVD#7 sample.

In order to obtain a 100-hour maintenance performance similar to the 800 cycle ALD-coated control (76.9%) and the CVD-coated control (76.1%), the coating weight for ALD/CVD-coated phosphor needs to be at least about 2.2 wt. % Al which is 0.6 wt. % Al higher than the 800-cycle ALD-coated control, but still significantly lower than the 3.8 wt. % Al for the CVD-coated control. Both CVD#8 and CVD#9 samples made by the ALD/CVD hybrid coating process have equal or better 100-hour maintenance results compared to the 800-cycle ALD and CVD-coated controls. Compared to the uncoated base phosphor, these two ALD/CVD coated phosphors suffered only an 8-9% loss of the initial brightness compared to the 20% loss suffered by CVD-coated control. Although the 800-cycle ALD-coated control only lost about 4% initial brightness after coating, the time required for the 800 ALD cycles necessary to make the coating is significantly longer than the combined 100 ALD cycles and CVD coating used for samples CVD#8 and CVD#9. As a result, the hybrid ALD/CVD coating method of this invention should be a more cost-effective method than the 800-cycle ALD process, retaining at least 90% of the initial brightness of the phosphor and still providing a high level of moisture resistance. In addition, because the coating is thinner (lower wt. % Al), the TMA precursor consumption is reduced compared to the conventional CVD encapsulation process.

TABLE 1

| Lamp Test | Lamp Attribute | Uncoated phosphor control | std. CVD coated control | ALD 800 cycle control | ALD 100 cycles | ALD 100 cycles + CVD #1 | ALD 100 cycles + CVD #2 | ALD 100 cycles + CVD #3 |
|---|---|---|---|---|---|---|---|---|
| | CIE x coord. | 0.181 | 0.184 | 0.180 | 0.180 | 0.183 | 0.182 | 0.182 |
| | CIE y coord. | 0.464 | 0.478 | 0.462 | 0.461 | 0.469 | 0.466 | 0.465 |
| 1 | 0 hr, cd/m$^2$ | 100.7 | 80.4 | 96.4 | 101.9 | 100.7 | 101.2 | 100.3 |
| 1 | Retained Initial Brightness 0 hr, % | 100 | 79.8 | 96.7 | 101.2 | 100 | 100.5 | 99.6 |
| 1 | 24 hr, cd/m$^2$ | 92.8 | 74.5 | 90.0 | 69.7 | 91.2 | 92.7 | 92.6 |
| 1 | 100 hr, cd/m$^2$ | 85.5 | 69.2 | 83.1 | 42.7 | 75.1 | 80.4 | 83.0 |
| 2 | 0 hr, cd/m$^2$ | — | 74.6 | 90.3 | 95.8 | 100.5 | 101.9 | 100.5 |
| 2 | 100 hr, cd/m$^2$ | — | 56.8 | 69.4 | 1.0 | 13.7 | 23.9 | 38.0 |
| 2 | Maint. % 100 hr/0 hr | — | 76.1 | 76.9 | 1.1 | 13.6 | 23.5 | 37.8 |
| | Al, coating wt. % | — | 3.8 | 1.6 | 0.26 | 0.64 | 0.74 | 0.84 |

TABLE 2

| Lamp Test | Lamp Attribute | ALD 100 cycles + CVD #4 | ALD 100 cycles + CVD #5 | ALD 100 cycles + CVD #6 | ALD 100 cycles + CVD #7 | ALD 100 cycles + CVD #8 | ALD 100 cycles + CVD #9 |
|---|---|---|---|---|---|---|---|
| | CIE x coord. | 0.181 | 0.181 | 0.183 | 0.183 | 0.183 | 0.181 |
| | CIE y coord. | 0.463 | 0.462 | 0.469 | 0.469 | 0.468 | 0.465 |
| 1 | 0 hr, cd/m$^2$ | 99.1 | 95.9 | 93.2 | 92.7 | 91.9 | 91.7 |
| 1 | Retained Initial Brightness 0 hr, % | 98.4 | 95.2 | 92.6 | 92.1 | 91.3 | 91.1 |

TABLE 2-continued

| Lamp Test | Lamp Attribute | ALD 100 cycles + CVD #4 | ALD 100 cycles + CVD #5 | ALD 100 cycles + CVD #6 | ALD 100 cycles + CVD #7 | ALD 100 cycles + CVD #8 | ALD 100 cycles + CVD #9 |
|---|---|---|---|---|---|---|---|
| 1 | 24 hr, cd/m$^2$ | 93.2 | 89.1 | 86.0 | 85.6 | 85.0 | 84.7 |
| 1 | 100 hr, cd/m$^2$ | 83.9 | 81.6 | 78.6 | 78.6 | 78.1 | 78.3 |
| 2 | 0 hr, cd/m$^2$ | 100.5 | 97.8 | 91.7 | 93.4 | 91.7 | 92.7 |
| 2 | 100 hr, cd/m$^2$ | 49.9 | 59.2 | 66.0 | 69.4 | 70.5 | 75.9 |
| 2 | Maint., % 100 hr/0 hr | 49.7 | 60.5 | 72.0 | 74.3 | 76.9 | 81.9 |
|  | Al, coating wt. % | 0.95 | 1.5 | 1.5 | 1.9 | 2.2 | 2.3 |

While there has been shown and described what are at the present considered the preferred embodiments of the invention, it will be obvious to those skilled in the art that various changes and modifications may be made therein without departing from the scope of the invention as defined by the appended claims.

We claim:

1. A coated electroluminescent phosphor, comprising: individual particles of a zinc sulfide-based electroluminescent phosphor wherein each particle is encapsulated in an aluminum oxyhydroxide coating, wherein the aluminum content of the coated electroluminescent phosphor is from 1 wt % to about 2.5 wt %, the phosphor exhibiting a retained initial brightness of at least 90% and having a moisture resistance equivalent to a CVD-coated phosphor having an aluminum oxyhydroxide coating wherein the aluminum content of the CVD coated phosphor is 3.8 weight percent.

2. The coated phosphor of claim 1 wherein the aluminum content of the coated electroluminescent phosphor is about 2.2 weight percent.

* * * * *